United States Patent

Schiller et al.

[11] Patent Number: 5,635,087
[45] Date of Patent: Jun. 3, 1997

[54] APPARATUS FOR PLASMA-ASSISTED HIGH RATE ELECTRON BEAM VAPORIZATION

[75] Inventors: Siegfried Schiller; Manfred Neumann; Henry Morgner, all of Dresden, Germany

[73] Assignee: Fraunhofer-Gesellschaft zur Foerderung der angewandten Forschung e.V., Munich, Germany

[21] Appl. No.: 416,869
[22] PCT Filed: Aug. 18, 1993
[86] PCT No.: PCT/DE93/00750
§ 371 Date: Jun. 12, 1995
§ 102(e) Date: Jun. 12, 1995
[87] PCT Pub. No.: WO94/09176
PCT Pub. Date: Apr. 28, 1994

[30] Foreign Application Priority Data

Oct. 19, 1992 [DE] Germany .................. 42 35 199.5

[51] Int. Cl.⁶ .................................................. B23K 10/00
[52] U.S. Cl. .......................... 219/121.43; 219/121.47; 219/121.15; 219/121.21; 219/123; 204/298.16
[58] Field of Search ..................... 219/121.43, 121.47, 219/76.16, 121.15, 121.21, 123; 204/298.01, 298.16; 427/509, 535, 497

[56] References Cited

U.S. PATENT DOCUMENTS

| 4,514,437 | 4/1985 | Nath | 427/39 |
|---|---|---|---|
| 4,524,717 | 6/1985 | Neumann et al. | 118/718 |
| 4,926,791 | 5/1990 | Hirose et al. | |
| 4,941,430 | 7/1990 | Watanabe et al. | 118/723 |
| 4,951,604 | 8/1990 | Temple et al. | 118/723 |
| 4,960,073 | 10/1990 | Suzuki et al. | |
| 5,099,790 | 3/1992 | Kawakami | |
| 5,302,208 | 4/1994 | Grimm et al. | 118/718 |
| 5,468,520 | 11/1995 | Williams | 427/560 |

FOREIGN PATENT DOCUMENTS 1-242773 9/1989 Japan .

OTHER PUBLICATIONS

*VEB Verlag Technik* entitled "Elektronenstrahltechnologic" by Siegfried Schiller et al., Berlin, 1976.
*Surface and Coatings Technology* entitled "Activated Reactive Ion Plating (ARIP)" by E. Moll et al., 39/40 (1989), PP. 475–486.

*Primary Examiner*—Mark H. Paschall
*Attorney, Agent, or Firm*—Evenson, McKeown, Edwards & Lenahan, P.L.L.C.

[57] ABSTRACT

It is known that improved coating properties can be obtained by plasma action in vacuum deposition, especially by vaporization. Substantially higher coating rates can be attained in vapor deposition, but, with high plasma densities, they result in excessive scattering of the electron beam and reduce the power density. According to the invention, a plasma source, preferably a hollow cathode are source, is arranged in the immediate vicinity of the substrate. Between the evaporator and the substrate there is a device for generating a magnetic field so that the region of high plasma density is separated from the evaporator and the electron beam by the magnetic field. The boundary field lines of this magnetic field run along an arc curving with respect to the substrate.

21 Claims, 2 Drawing Sheets

APPARATUS FOR PLASMA-ASSISTED HIGH RATE ELECTRON BEAM VAPORIZATION

BACKGROUND OF THE INVENTION

The invention relates to an apparatus for the plasma-assisted, high rate electron beam vaporization, preferably for the vapor deposition of coatings of compounds on strip-like and plate-like substrates. Typical fields of application are the vaporizing of plastic films with barrier layers for the packaging industry, with scratch-proof coatings for sun-shielding films or foils or with selectively reflecting coatings for heat-absorbing films or foils. Other uses occur in the coating of metallic strips for decorative purposes and for corrosion protection, as well as in the coating of plastic or glass plates for obtaining scratch-proof or selectively reflecting surfaces. However, better coating characteristics also result from the additional plasma action when vapor depositing metallic coatings on different substrates. In particular it is possible to obtain a higher packing density of the coating and therefore improve mechanical, optical and electrical characteristics.

It is known that as a result of plasma action in vacuum coating improved coating characteristics can be obtained. For example, during sputtering, which naturally takes place under plasma action, in general better coating characteristics can be obtained than when vaporizing. However, the coating rates during sputtering are relatively low and are inadequate for many uses. It is possible to achieve higher rates by using the vaporizing procedure.

It is also known to obtain similar coating characteristics to those obtained with sputtering in the case of plasma-assisted vaporizing. Simultaneously with the vapor-deposited material a plasma or the ions extracted from a plasma are made to act on the substrate. The plasma is produced either by ionizing the vapor zone by means of a separately produced low energy electron beam or by igniting an independent discharge between the vaporizer and the substrate (Schiller, S., Heisig, U., Panzer, S., Elekronenstrahltechnologie, VEB Verlag Technik, Berlin, 1976, p.187ff and p.136ff).

The highest coating rates and therefore the lowest coating costs can be achieved by high rate electron beam vaporization. During the vapor deposition of metals coating rates up to 50 μm/s are obtained, but also when vapor depositing compounds coating rates of a few μm/s can be obtained. In order to obtain at such high rates positive effects with regards to the coating characteristics by means of an additional plasma action, correspondingly high plasma densities are required on the substrate. High plasma densities can e.g. be produced with per se known arc discharges. However, it has not hitherto been possible to simultaneously bring into effect the high vaporizing rates and the high plasma densities on the substrate. The high plasma densities lead to such a pronounced spreading or scattering of the electron beam required for vaporization, that it is not possible to achieve the power densities required for high rate vaporization.

It is also known to allow to burn in the vaporizer crucible a plasma arc discharge in addition to the electron beam (Moil, E., Buhl, R., Pulker, H.K., Bergmann, E., Activated Reactive Ion Plating Surface and Coatings Technology 39/40(1989), pp.475–486). However, this additional vaporizer heating does not lead to the coating rates obtained with purely high rate electron beam vaporization. In addition, this procedure is only suitable for vaporizing conductive metals and not for vaporizing insulating compounds. Moreover, the plasma action preferably takes place in the vicinity of the vaporizer crucible and not in the vicinity of the substrate.

SUMMARY OF THE INVENTION

The problem of the invention is to provide an apparatus for plasma-assisted, high rate electron beam vaporization making it possible, whilst maintaining the high vaporization rates of high rate electron beam vaporization to bring a high density plasma into action in the vicinity of the substrate to be coated. In addition, an inadmissible spreading and power density action of the electron beam by the necessary high density plasma are to be avoided.

According to the invention this problem is solved by the features of claim 1. Further advantageous developments of the apparatus are described in the subclaims.

As a result of the construction of the apparatus according to the invention, i.e. the geometrical arrangement and construction of the pole pieces or shoes of the magnetic field-generating device, the spatial association of the substrate, the hollow cathode arc source and the magnetic field, it is possible to adjust the spacing between the area of the highest plasma density and the substrate surface in such a way that there is a maximum plasma action on the substrate surface, but the substrate is not thermally damaged.

It has proved appropriate to select the maximum field strength of the magnetic field arranged in shield-like manner between the high plasma density area and the vaporizer, respectively electron beam between 1 and 10 kA/m, preferably between 2 and 5 kA/m. Smaller field strengths can lead to an inadequate separation, whereas higher field strengths can lead to an undesired, strong deflection of the electron beam.

It is particularly advantageous for producing the magnetic field and guiding the electron beam to use a per se known magnetic trap. This magnetic trap, which is a magnetic system with pole pieces on either side of the vaporizer crucible, produces over the latter a generally horizontal magnetic field, through which the electrons backscattered on the vaporizing material are kept away from the substrate to be coated. The electron beam is injected approximately perpendicular to the direction of the magnetic field lines or against the field lines into the horizontal magnetic field (East German patents 55 154, 64 107 and 204 947). The combination of the magnetic plasma shielding according to the invention and the magnetic trap for shielding against backscattered electrodes is particularly advantageous, because in the interest of a maximum plasma density on the substrate surface and due to the thermal action on the substrate associated therewith, an additional stressing by electrons backscattered on the vaporizer is undesired.

For producing the high plasma density area in the vicinity of the substrate surface it is possible to use with particular advantage hollow cathode arc sources. This makes it possible to attain charge carrier densities adapted to the high rate electron beam vaporization between $10^{11}$ and $10^{12}$ cm$^{-3}$. The discharge arc follows the path of the field lines in the homogeneous marginal area of the magnetic field and strikes the anode of the arc source arranged on the opposite pole piece. As a result of the curvature of the field lines in the inhomogeneous marginal area of the magnetic field the arc discharge acquires an outward curvature in the direction of the substrate. The discharge arc is guided in clearly defined manner along the curved field lines, so that an uncontrollable arc path and therefore an undesired, direct impact of the discharge arc on the substrate or other parts of the vaporizing chamber are avoided.

For the uniform coating of larger substrates it is appropriate to fan the discharge arc through an alternating magnetic field at the location of the arc exit from the hollow cathode into a plane parallel to the substrate surface. The deflection frequency must be chosen so high that each point of the layer building up on the substrate is swept several times by the discharge arc. It is advantageous in the case of very wide substrates to arrange in juxtaposed manner several hollow cathodes along one pole piece for producing the magnetic field and to place a common, correspondingly elongated anode in front of the facing pole piece. Here again it is appropriate to deflect the individual discharge arcs of the hollow cathode by alternating magnetic fields in fan-like manner parallel to substrate surface, in order to obtain a high uniformity of the plasma zone perpendicular to the arc direction.

During the deposition of metal coatings a water-cooled copper plate has proved advantageous as the anode for hollow cathode discharges. When depositing insulating layers by reactive vaporization of metals or by direct vaporization of insulating compounds after a very short time the anode is covered with an insulating coating. It is appropriate in this case to allow the reactive gas which is in any case necessary for the deposition of insulating coatings to enter the plasma zone through holes in the anode. This firstly leads to an intense ionization and excitation of this reactive gas and secondly in the immediate vicinity of these holes the gas flow reduces the condensation of insulating coatings, so that the arc discharges function for a much longer operating period. The second effect can also be achieved by introducing an inert gas in place of a reactive gas. A further increase in the operating time is obtained if a vapor shield is placed between the plate-like anode and the vaporizer and/or by inclining the anode against the vapor jet a direct vaporization of the anode surface is avoided. Another possibility for avoiding insulating coatings on the anode consist of heating the anode to such an extent that as a result of revaporization no insulating coatings can be deposited. In the simplest case heating can take place by making the anode from a heat-resistant material and maintaining it in thermally insulated manner, so that it is heated to the necessary temperature by the electrons impacting from the hollow cathode discharge. It is advantageous to build up the anode from individual bars, preferably of W, Ta or Mo and to place radiation shielding plates on the back of the anode bars. As a result of the heat conduction along the bars a wide area along the anode is heated and kept free, so that there is a widening of the plasma zone and in the case of several juxtaposed hollow cathodes a continuous, coating-free anode is obtained. As a result of the radiation shielding plates, for a given arc capacity a maximum anode bar heating is obtained. If in the case of extremely high vaporization rates and particularly critical vaporization materials a coating of the anode still occurs, it is then appropriate to additionally heat the anode by current passage. In this case it is necessary to make the current flow through the anode in such a way that the external magnetic field caused by the current flow does not inadmissibly influence the discharge arc.

According to an advantageous development the current is allowed to flow in meandering manner through parallel-arranged heating rods, preferably made from W, Ta or Mo and behind the same are provided radiation shielding plates. According to another advantageous development the anode is built up from two plates or rod lattices successively arranged in the arc direction and through which in both cases current flows in opposite directions. It is also appropriate to make the contacting of the anode and the anode leads such that also the outflowing arc current produces no disturbing magnetic field in the vicinity of the hollow cathode arc.

BRIEF DESCRIPTION OF DRAWINGS

The invention is described in greater detail hereinafter relative to two embodiments and the attached drawings, wherein show.

DETAILED DESCRIPTION OF DRAWINGS

Figure 1:
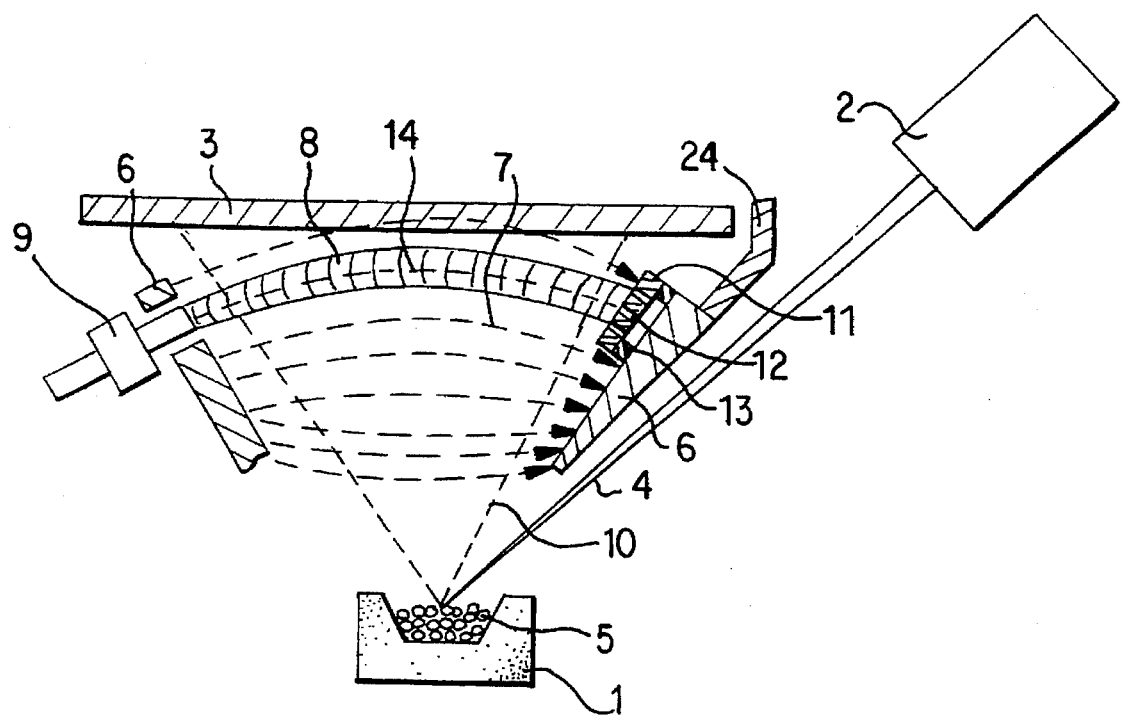
FIG. 1 A section through a vaporizer for planar substrates with direct injection of the electron beam.

The apparatus according to the invention shown in FIG. 1 comprises a vaporizer 1, an electron gun 2 arranged in inclined manner above it and the plate-like substrate 3 placed above the vaporizer 1 and which is to be coated and is moved perpendicular to the paper plane over the vaporizer 1. The electron gun 2 is so flanged to the not shown vacuum chamber that the electron beam 4 strikes in inclined manner on the vaporizing material 5 located in the vaporizer 1 and in known manner can be deflected onto the surface. The vaporizing material 5 is $Al_2O_3$. Above and on either side of the vaporizer 1 are provided facing pole pieces or shoes 6 in such a way that a magnetic field 7 extending perpendicular to the paper plane is obtained and whose field lines are mainly parallel to the substrate 3. The maximum field strength in the central and lower area of the magnetic field 7 is 2 kA/m. In the upper, inhomogeneous marginal area of the magnetic field 7 is produced a zone of high density plasma 8 by means of several juxtaposed hollow cathodes 9, which are located in openings of the left-hand pole piece 6. (Only one hollow cathode 9 is shown, the others being positioned parallel thereto upstream and downstream of the drawing plane.) On the inside of the right-hand pole piece 6 is provided a watercooled anode 11 inclined against the vapor beam 10 and elongated in accordance with the number of hollow cathodes 9. The anode 11 has holes 12 from which reactive gas $O_2$ is introduced from the back of the cathode 11 into the area of the high density plasma 8. The anode 11 is fixed by means of insulators 13 and is connected in the conventional way to the power supply means for the hollow cathodes 9. From the hollow cathodes 9 burn parallel discharge arcs 14 to the anode 11 and which are curved towards the substrate 3. These discharge arcs 14 form the area of the high density plasma 8. So that in spite of the limited lateral extension of the tubular discharge arcs 14 there is a uniform plasma action over the entire substrate, during the coating said substrate is moved perpendicular to the discharge arcs 14.

Figure 2:
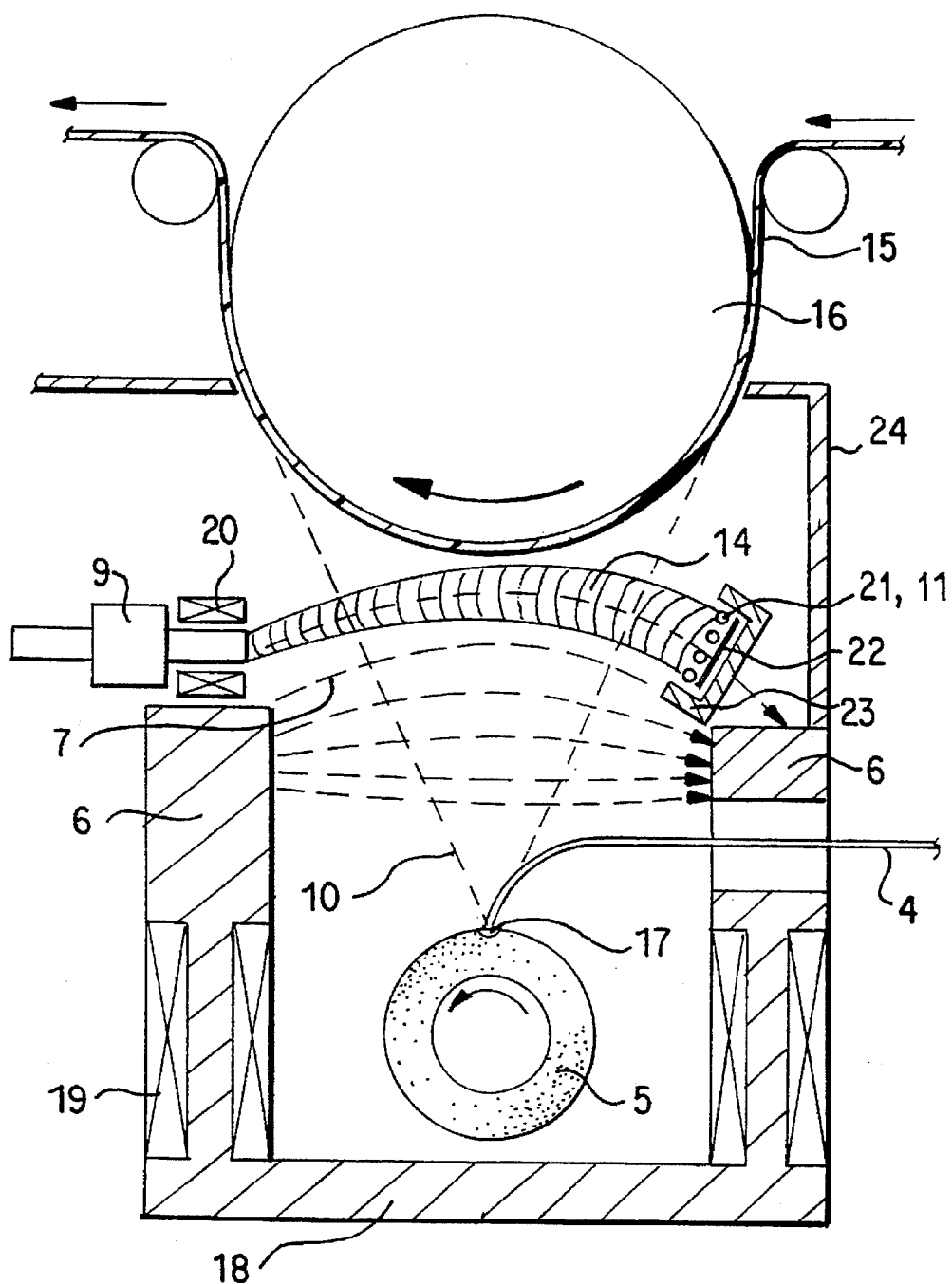
FIG. 2 A section through a vaporizer with a magnetic trap for strip-like substrates.

FIG. 2 shows a per se known vaporizer for coating plastic films 15, which pass over a cooling roller 16 through the vaporizing zone. The vaporizing material 5 is a tube of $SiO_x$, which constantly rotates about its longitudinal axis. The electron beam 4 produced with a not shown electron gun is injected horizontally into the vaporizing zone and is so bent and deflected that it is moved linearly on the tube parallel to its longitudinal axis and consequently a vaporizing line 17 is formed. To produce the necessary magnetic field a per se known magnetic trap 18 is so positioned that a magnetic field 7 is formed between the pole pieces 6 by the magnetic coils 19. The magnetic field 7 has a maximum field strength of 5 kA/m, so as to ensure that the electrons backscattered on the vaporizing material 5 do not reach the heat-sensitive film 15. The tubular vaporizing material 5 extends over the entire width of the film 15 to be coated. The uniform vaporization over the entire film width is ensured by programme-controlled deflection of the electron beam 4 along the vaporizing line 17 on the surface of the vaporizing material 5.

The magnetic field 7 produced by the pole pieces 6 has at least the same extension perpendicular to the drawing plane. Several hollow cathodes 9 are juxtaposed over the film width above the left-hand pole piece 6. By means of suitable coils 20 an alternating magnetic field is produced at each hollow cathode 9 and this leads to a fan-like deflection of the particular discharge arc 14 parallel to the film face, i.e. perpendicular to the drawing plane.

The reciprocal spacing of the juxtaposed hollow cathodes 9 and consequently their number per film width is dependent on the requirements made on the uniformity of the plasma action. The individual discharge arcs 14 fanned out perpendicular to the drawing plane and which mutually overlap burn to the anode 11 located on the opposite pole piece 6 and extending over the entire film width. The anode 11 comprises several, grid-like, thermally insulated fixed tungsten rods 21 behind which is positioned a heating beam-reflecting radiation shielding plate 22. The tungsten rods 21 are fixed by not shown insulators to the pole piece 6 and connected to the power supply means for the hollow cathode 9. The fan surface of the anode 11 is inclined against the direction of the vapor jet and is protected against direct vaporization by a vapor shield 23.

In all cases suitable means must be provided for ensuring that the plasma does not influence the electron beam 4 through by-passing or getting round the magnetic field 7. Shields 24 are provided for this purpose and are so positioned that electrons or ions from discharge arcs 14 cannot in other ways come into the vicinity of the electron beam 4.

What is claimed is:

1. An apparatus for plasma-assisted high rate electron beam vaporization having a vaporizer containing a vaporizing material and an associated electron gun producing an electron beam, as well as a plasma source for producing a high density plasma, the apparatus comprising:

a magnetic field-generating device having pole pieces producing a magnetic field, said magnetic field-generating device being positioned between the vaporizer and the substrate such that a high plasma density area produced by a plasma source located in an immediate vicinity of the substrate to be coated is separated from the vaporizing material and the electron beam acting on the vaporizing material by said magnetic field;

wherein said magnetic field is mainly oriented parallel to the substrate, said high plasma density area being guided along marginal field lines of the magnetic field in an arc curved towards the substrate.

2. Apparatus according to claim 1, wherein said magnetic field-generating device is constructed and positioned such that a maximum field strength of the magnetic field between the high plasma density area and the vaporizer or the electron beam is 1 to 10 kA/m.

3. Apparatus according to claim 1, wherein the magnetic field-generating device is a magnetic trap for shielding backscattered electrons.

4. Apparatus according to claim 1, wherein as the plasma source and as a function of a width of the substrate to be coated, at least one hollow cathode is placed between one of said pole pieces of the magnetic filed-generating device and the substrate, and that on an inside surface of another of said pole pieces which faces said one pole piece, an anode is positioned, said anode having an elongated length corresponding with a spatial arrangement of a number of hollow cathodes.

5. Apparatus according to claim 4, wherein said number of hollow cathodes are located in openings of the one-pole piece.

6. Apparatus according to claim 4, wherein at the location of an arc exit from the hollow cathodes, coils are provided for generating an alternating magnetic field for a fan-like deflection of an arc parallel to a surface of the substrate.

7. Apparatus according to claim 4, wherein the anode belonging to the hollow cathodes is inclined.

8. Apparatus according to claim 4, wherein a vapor shield is fitted to the underside of the anode.

9. Apparatus according to claim 7, wherein the anode is a water-cooled metal plate.

10. Apparatus according to claim 9, wherein the anode is a water-cooled metal plate.

11. Apparatus according to claim 7, wherein holes are arranged in the plate-like anode for introducing one of reactive gas and inert gas.

12. Apparatus according to claim 9, wherein holes are arranged in the plate-like anode for introducing one of reactive gas and inert gas.

13. Apparatus according to claim 4, wherein the anode is made from heat resistant material, if fixed in a heat insulating manner to the other pole piece, and that radiation shielding plates are located on a back of the anode.

14. Apparatus according to claim 7, wherein the anode comprises heat resistant bars.

15. Apparatus according to claim 8, wherein the anode comprises heat resistant bars.

16. Apparatus according to claim 7, wherein the anode is additionally heated by current passage, and wherein power supplies for the heating are positioned inside and outside the anode in such a manner that external magnetic fields produced by a current flow are substantially compensated in a vicinity of the discharge arc.

17. Apparatus according to claim 8, wherein the anode is additionally heated by current passage, and wherein power supplies for the heating are positioned inside and outside the anode in such a manner that external magnetic fields produced by a current flow are substantially compensated in a vicinity of the discharge arc.

18. Apparatus according to claim 2, wherein the maximum field strength is between 2 to 5 kA/m.

19. Apparatus according to claim 9, wherein the anode is made of copper.

20. Apparatus according to claim 14, wherein the anode consists of one of the group of tungsten, tantalum or molybdenum.

21. An apparatus according to claim 1, wherein said plasma-assisted high rate electron beam vaporization has evaporation rates of from a few µm/s to 50 µm/s.

* * * * *